(12) United States Patent
Lai et al.

(10) Patent No.: US 7,333,164 B2
(45) Date of Patent: Feb. 19, 2008

(54) LIQUID CRYSTAL MODULE

(75) Inventors: Ching-Kun Lai, Changhua (TW);
Mei-Hui Lin, Yung Ho (TW);
Chung-Te Lee, Hsinchu (TW)

(73) Assignee: HannStar Display Corporation (TW)

( * ) Notice: Subject to any disclaimer, the term of this patent is extended or adjusted under 35 U.S.C. 154(b) by 119 days.

(21) Appl. No.: 11/386,993

(22) Filed: Mar. 21, 2006

(65) Prior Publication Data

US 2006/0158580 A1    Jul. 20, 2006

Related U.S. Application Data

(62) Division of application No. 10/671,386, filed on Sep. 25, 2003, now Pat. No. 7,038,741.

(30) Foreign Application Priority Data

Feb. 27, 2003    (TW)    .............................. 92203109 U

(51) Int. Cl.
*G02F 1/1333*    (2006.01)
(52) U.S. Cl. ........................ 349/58; 349/150; 361/681; 439/493
(58) Field of Classification Search .................. 349/58, 349/60, 65, 63, 150, 151, 40; 361/681; 362/362; 439/55, 493
See application file for complete search history.

(56) References Cited

U.S. PATENT DOCUMENTS

| | | | |
|---|---|---|---|
| 5,537,177 A | 7/1996 | Terunuma | |
| 6,154,261 A | 11/2000 | Shim | |
| 6,295,103 B1 | 9/2001 | Yamatani et al. | |
| 6,686,979 B2 | 2/2004 | Yoshino | |

*Primary Examiner*—Thoi V. Duong
(74) *Attorney, Agent, or Firm*—Knobbe Martens Olson & Bear LLP

(57) ABSTRACT

A liquid crystal module is disclosed. In one embodiment, the liquid crystal module includes a first frame and a second frame configured to support a back light module and configured to fixedly secure a liquid crystal display panel and the back light module together with the first frame. The second frame comprises: i) a plurality of fasteners, each fastener including a first clip piece and a second clip piece opposite to the first clip piece, wherein a gap is disposed between the first clip piece and the second clip piece configured to fixedly secure a flexible printed circuit board therebetween, ii) a recess configured to receive a control printed circuit board, iii) a slot disposed at a periphery of the recess and configured to engage against one end of the control printed circuit board, iv) a plurality of protrusions disposed at the periphery of the recess configured to position the control printed circuit board and v) a plurality of resilient engaging pieces configured to fix the control printed circuit board.

16 Claims, 6 Drawing Sheets

LIQUID CRYSTAL MODULE

RELATED APPLICATIONS

This application is a divisional application, and claims the benefit under 35 U.S.C. §120 of U.S. application Ser. No. 10/671,386, filed Sep. 25, 2003, now U.S. Pat. No. 7,038,741, the full disclosure of which is incorporated herein by reference.

This application also relates to U.S. patent application entitled "GROUNDING STRUCTURE FOR A LIQUID CRYSTAL MODULE", filed on even date herewith and having application Ser. No. 11/386,193, which is hereby incorporated by reference.

BACKGROUND OF THE INVENTION

1. Field of Invention

The present invention relates to a frame structure and a grounding structure. More particularly, the present invention relates to a frame structure and a grounding structure of a liquid crystal module (LCM).

2. Description of Related Art

Liquid crystal display (LCD) has so many advantages, including high picture quality, small volume, light weight, low driving voltage and low power consumption, that LCDs are widely applied in electronic products such as medium or small-sized portable televisions, mobile phones, videos, notebooks, monitors for desktop computers and projection-type televisions. Therefore, as time goes by, LCDs gradually replace present cathode ray tube (CRT) monitors.

The primary processes to manufacture a LCD includes a thin film transistor array substrate process, a color filter layer process, a liquid crystal cell assembling process, and a liquid crystal module (LCM) assembling process.

The LCM assembling process is to assemble a metal bezel, a liquid crystal display panel and a back light module together. After finishing the LCM assembling process, the processes to manufacture a LCD is completed. More specifically, the LCM assembling process is to overlap the liquid crystal display panel, on which a flexible printed circuit board (FPC) is fastened, with the back light module first. Then, the metal bezel locks with the fame, wherein the FPC is bent to be secured at back of the fame and is electrically connected to a control printed circuit board.

However, a lot of problems exist in the conventional LCM assembling process. For example, reference is made to FIG. 1, which illustrates how to fixedly secure a flexible printed circuit board (FPC) 12 on a frame 11 according to prior arts. When the driving ICs are attached on the liquid crystal display panel (not shown) by chip-on-glass (COG) technique, the area of the FPC 12, which is connected to the driving ICs, is large. According to the conventional method, the FPC 12 is fastened on the frame 11 via the tape 13 because of large area of the FPC 12. However, this kind of assembly procedure takes a lot of time. Besides, owing to adoption of COG technique, the FPC 12 is bent twice, and the produced torsion easily makes the FPC 12 separate outward from the frame 11. The FPC 12 is not thoroughly secured on the frame 11.

Moreover, as far as the control printed circuit board (control PCB) 14, which is electrically connected to the connector 15 and the FPC 12, is fastened on the frame 11 via the screws. However, this kind of assembly procedure takes a lot of time and consumes cost of screws.

Reference is made to FIG. 2, which is a partial perspective view illustrating a structure of a conventional LCM. The control PCB 14 is electrically connected to the grounding copper foil 16 by welding at one end, and keeps electrically contact with the metal bezel 10 at the other end. The grounding copper foil 16 is fastened on the metal bezel 10 via the screw through the hole 17. However, this kind of assembly procedure takes a lot of time and consumes cost of screws. In case that the metal bezel 10 is not thick enough, the space is limited to form a hole 17 for securing the grounding copper foil 16 on the metal bezel 10 via the screw.

SUMMARY OF CERTAIN INVENTIVE ASPECTS

One aspect of the present invention provides a frame structure adapted for fixedly securing a FPC which is electrically connected to a liquid crystal display panel, and for fixedly securing a control PCB which is electrically connected to the FPC.

Another aspect of the present invention provides a grounding structure for protecting a control PCB of a LCD from electro-magnetic interference.

Another aspect of the present invention provides a frame structure of a liquid crystal module, the frame being adapted for fixedly securing a flexible printed circuit board which is electrically connected to a liquid crystal display panel, and for fixedly securing a control printed circuit board which is electrically connected to the flexible printed circuit board, is provided. The frame includes a plurality of fasteners and a recess for receiving the control printed circuit board. Each fastener including a first clip piece and a second clip piece. A periphery of the recess includes a slot, a plurality of protrusions and a plurality of resilient engaging pieces. By clipping the flexible printed circuit board between the first clip piece and the second clip piece, the flexible printed circuit board is fixedly secured on the frame. By engaging the control printed circuit board on the recess with the slot, the protrusions and the resilient engaging pieces, the control printed circuit board is fixedly secured on the frame.

Another aspect of the present invention provides a grounding structure of a liquid crystal module, the grounding structure being adapted for protecting a control printed circuit board of the liquid crystal module from electro-magnetic interference, is provided. The grounding structure includes frame for receiving the control printed circuit board, a grounding conductive sheet, and a metal bezel for locking around the frame. One end of the grounding conductive sheet is electrically connected to the control printed circuit board, and the other end comprises a first engaging member. The metal bezel includes a second engaging member, wherein the second engaging member engages with the first engaging member.

It is to be understood that both the foregoing general description and the following detailed description are examples only, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF CERTAIN INVENTIVE EMBODIMENTS

Figure 1:
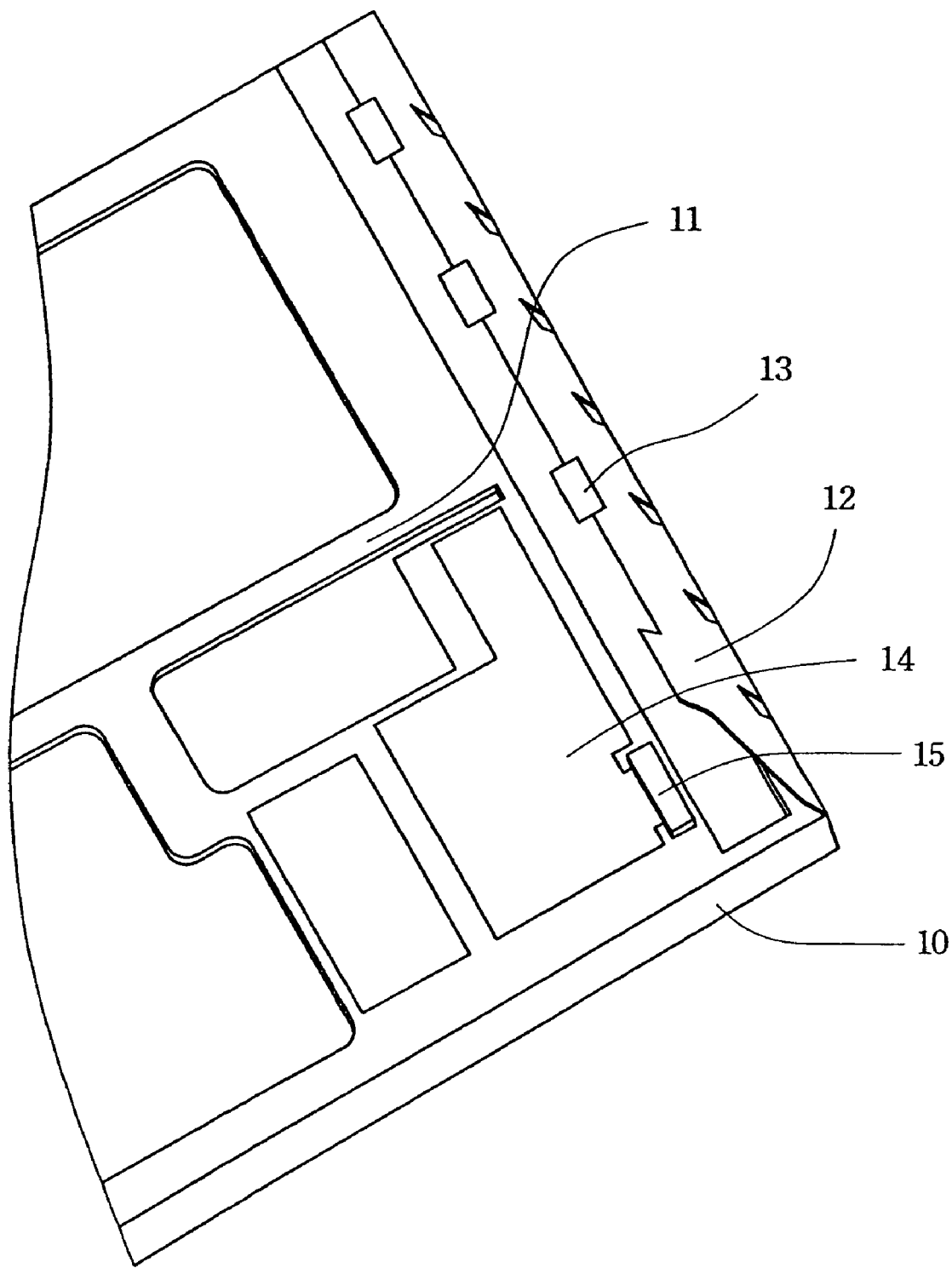
FIG. 1 illustrates how to fixedly secure a flexible printed circuit board on a frame according to prior arts.
Figure 2:
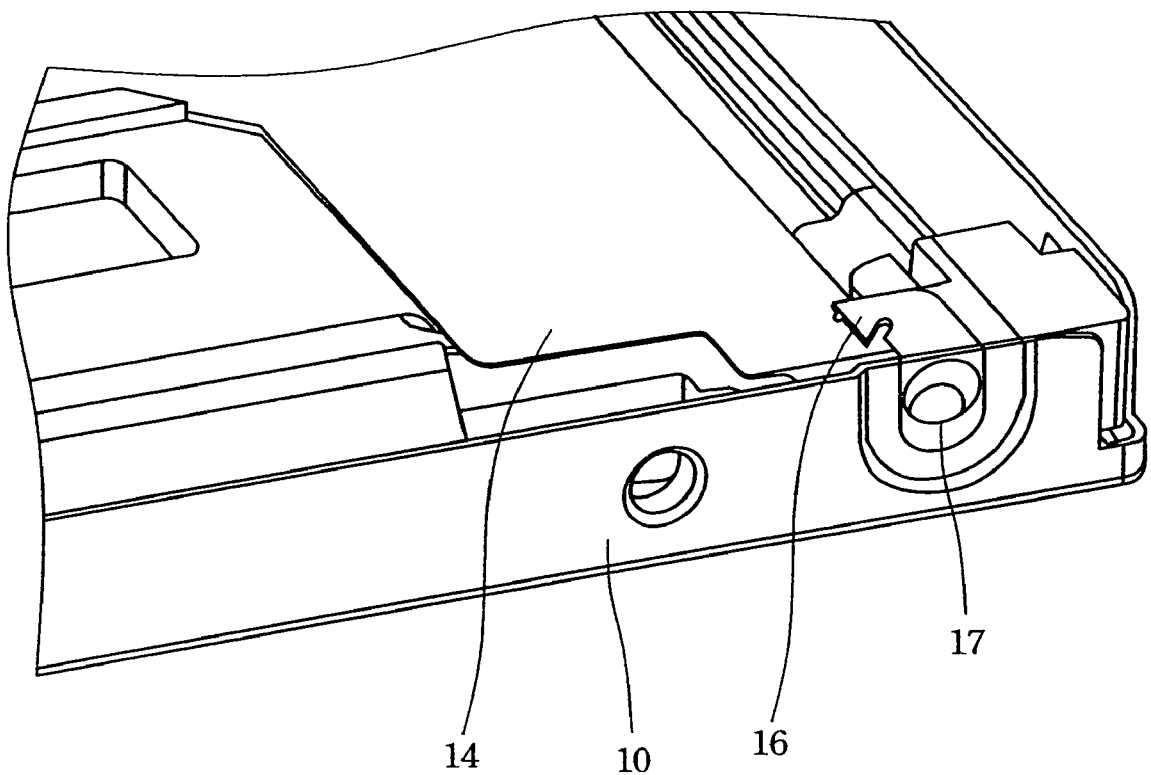
FIG. 2 is a partial perspective view illustrating a structure of a conventional LCM.

Reference will now be made in detail to the present preferred embodiments of the invention, examples of which are illustrated in the accompanying drawings. Wherever possible, the same reference numbers are used in the drawings and the description to refer to the same or like parts.

Figure 3:
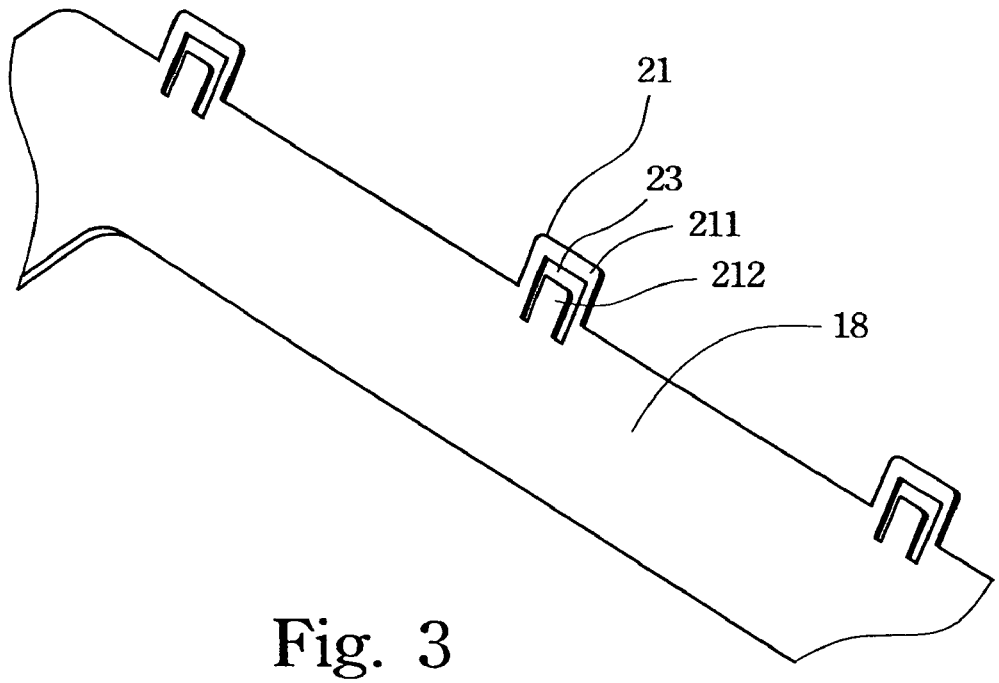
FIG. 3 is a partial perspective view illustrating a structure of a frame in accordance with the present invention.
Figure 4:
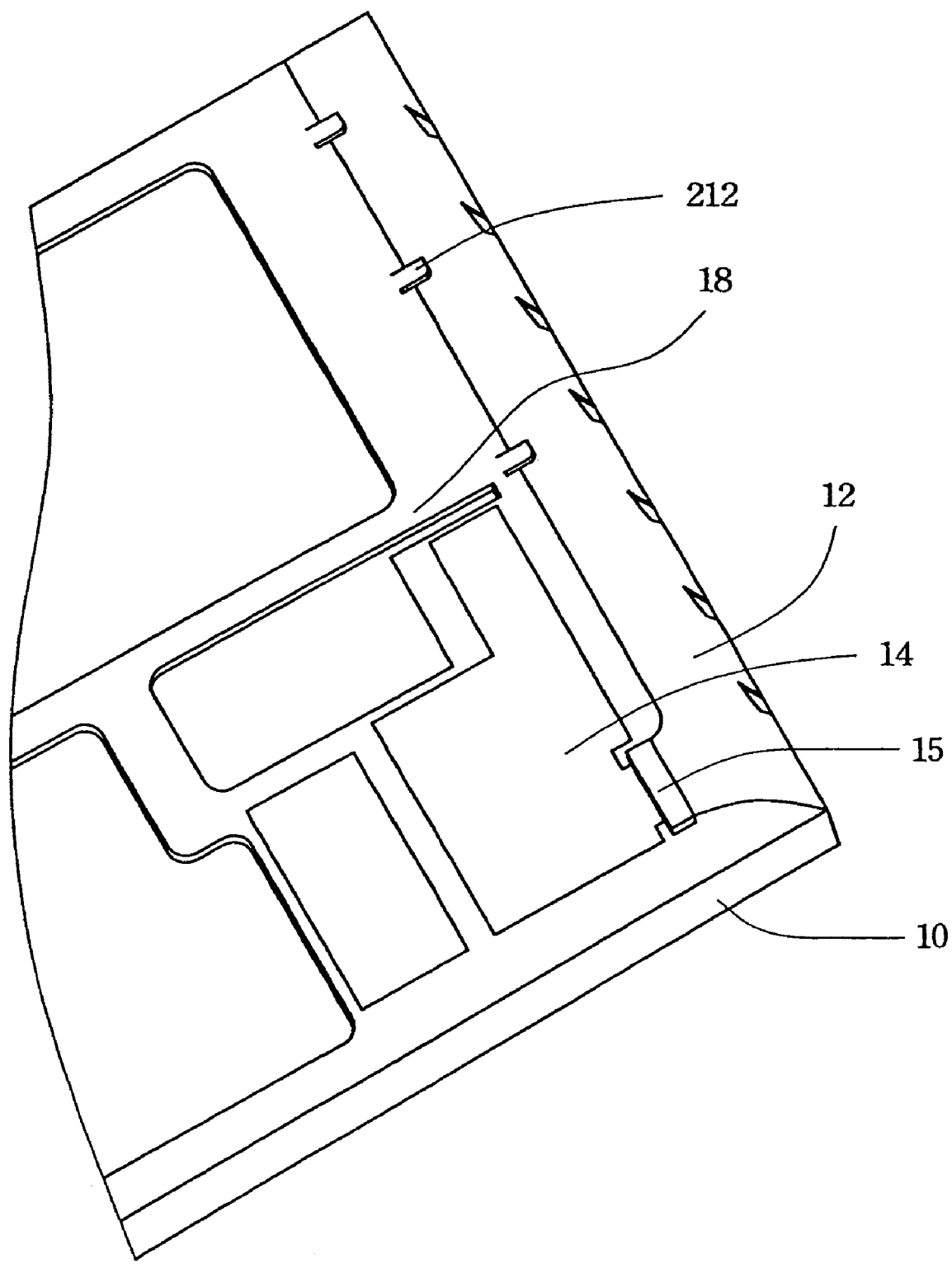
FIG. 4 illustrates how to fixedly secure a flexible printed circuit board on a frame according to the present invention.

Reference is made to FIG. 3, which is a partial perspective view illustrating a structure of a frame in accordance with the present invention. The frame 18 can be formed by integral injection molding, and is preferably made of plastic. A plurality of fasteners 21 are formed on the frame 18. Each fastener 21 includes a first clip piece 212 and a second clip piece 211. Covered area of the first clip piece 212 is larger than covered area of the second clip piece 211. A gap 23 is disposed between the first clip piece 212 and the second clip piece 211. As shown in FIG. 4, to assemble the FPC 12 with the frame 18, the FPC 12 is inserted into a position between the first clip piece 212 and the second clip piece 211.

Figure 5:
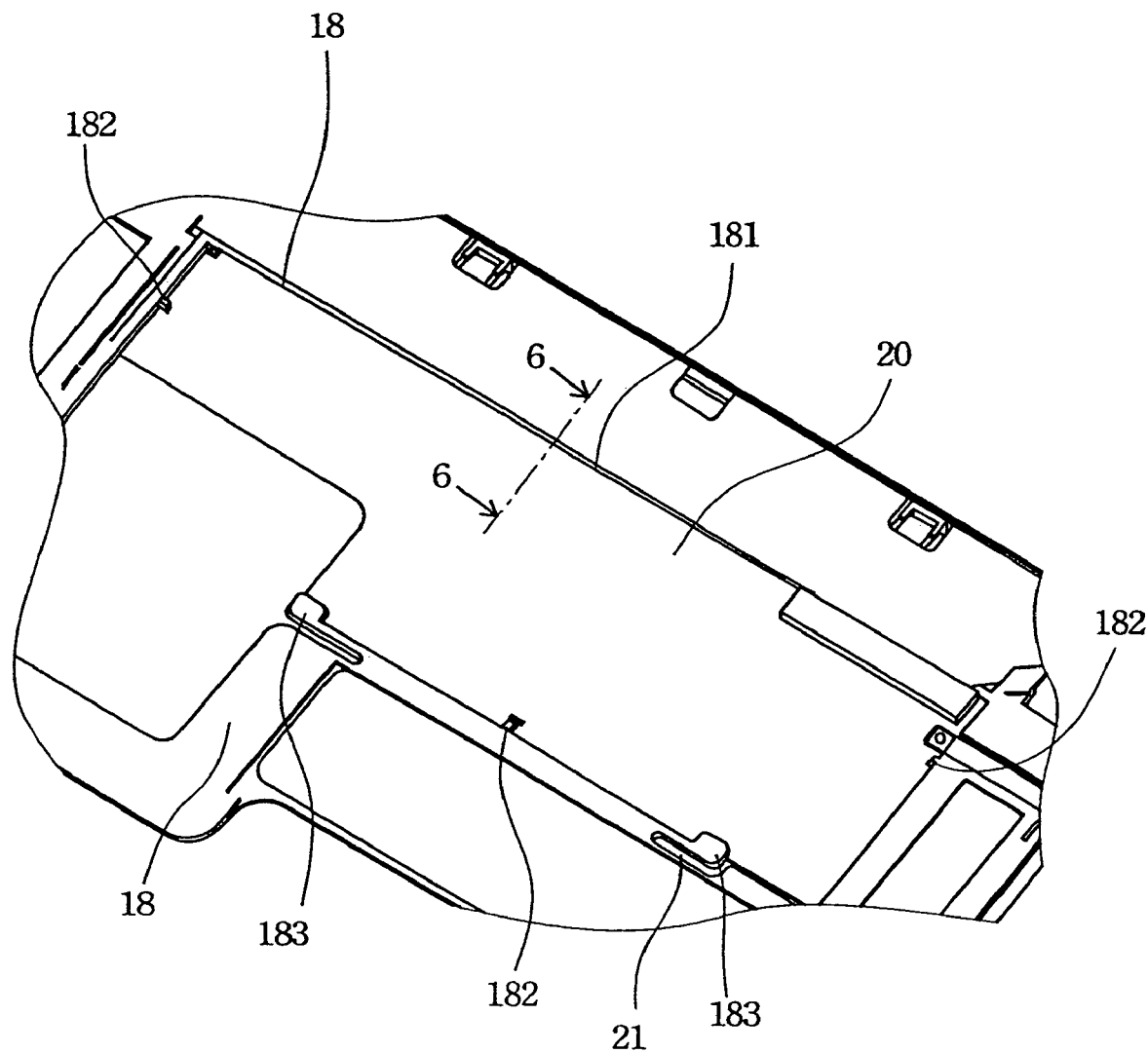
FIG. 5 illustrates how to fixedly secure a control printed circuit board on a frame according to the present invention.
Figure 6:
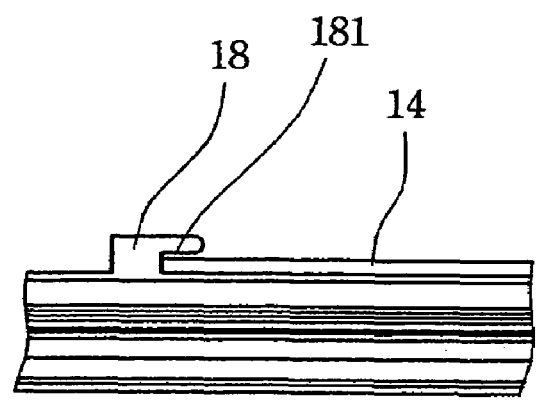
FIG. 6 is a perspective, cross-sectional view of FIG. 5 taken along 6-6.

Reference is made to FIGS. 5 and 6. FIG. 5 illustrates how to fixedly secure a control printed circuit board on a frame according to the present invention. FIG. 6 is a perspective, cross-sectional view of FIG. 5 taken along 6-6. A recess 20 is formed on the frame 18 for receiving the control PCB 14. A periphery of the recess 20 includes a slot 181, a plurality of protrusions 182 and a plurality of resilient engaging pieces 183. A gap 21 is disposed between the resilient engaging piece 183 and a body of the frame 18. To assemble the control PCB 14 with the frame 18, the control PCB 14 is inserted into the slot 181, and positioned by the protrusions 182. After the resilient engaging pieces 183 are pulled backward and is released, the control PCB 14 can be fastened into the recess 20. By engaging the control PCB 14 on the recess with the slot 181, the protrusions 182 and the resilient engaging pieces 183, the control PCB 14 is fixedly secured on the frame 18.

Figure 7:
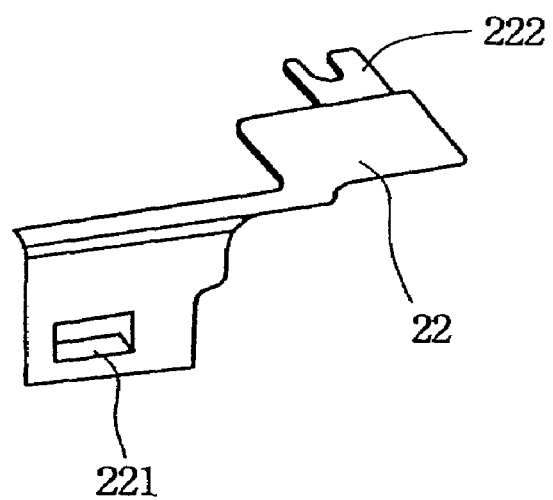
FIG. 7 is a perspective view illustrating a structure of a grounding copper foil in accordance with the present invention.
Figure 8:
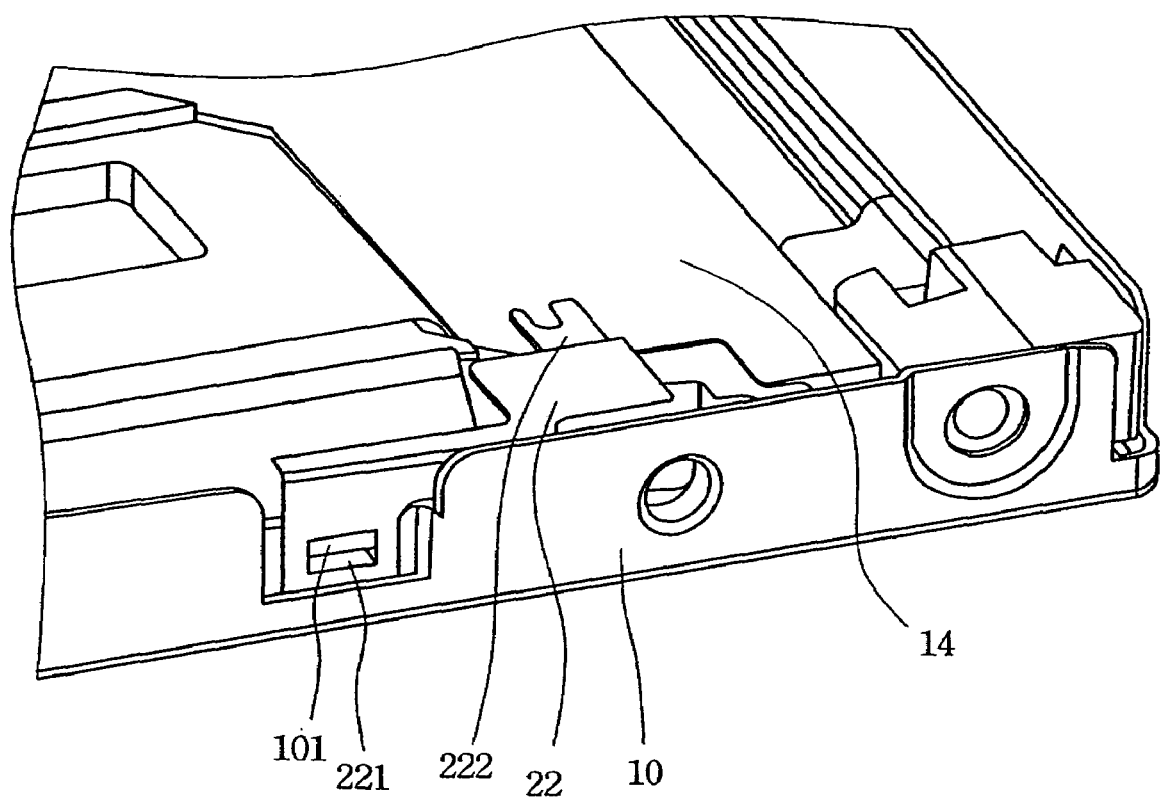
FIG. 8 is a partial perspective view illustrating a structure of a grounding structure in accordance with the present invention.

Reference is made to FIGS. 7 and 8. FIG. 7 is a perspective view illustrating a structure of a grounding copper foil in accordance with the present invention. FIG. 8 is a partial perspective view illustrating a structure of a grounding structure in accordance with the present invention. To assemble the grounding copper foil 22 with the LCM, a soldering portion 222 of the grounding copper foil 22 is welded onto the control PCB 14, and a resilient piece 221 of the grounding copper foil 22 engages with a hook 101 of the metal bezel 10. Certainly, other kinds of designs to assemble the grounding copper foil 22 with the metal bezel 10 are also feasible. For example, an opening is formed on the grounding copper foil 22, and a hook is formed on the metal bezel 10, wherein the opening can engage with the hook.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A liquid crystal module, comprising:
   a first frame;
   a liquid crystal display panel including a liquid crystal layer between a pair of substrates;
   a back light module disposed beneath the liquid crystal display panel configured to provide a planar light;
   a second frame configured to support the back light module, the second frame assembling with the first frame to fixedly secure the liquid crystal display panel and the back light module;
   a flexible printed circuit board, wherein one end of the flexible printed circuit board is electrically connected to one of the substrates, and the other end is bent to be secured at back of the second frame; and
   a control printed circuit board, wherein one end of the control printed circuit board is electrically connected to the flexible printed circuit board,
   wherein the second frame comprises:
      a plurality of fasteners, each fastener including a first clip piece and a second clip piece opposite to the first clip piece, wherein a gap is disposed between the first clip piece and the second clip piece configured to fixedly secure the flexible printed circuit board therebetween;
      a recess disposed at the second frame configured to receive the control printed circuit board;
      a slot disposed at a periphery of the recess configured to engage against one end of the control printed circuit board;
      a plurality of protrusions disposed at the periphery of the recess configured to position the control printed circuit board; and
      a plurality of resilient engaging pieces configured to fix the control printed circuit board.

2. The liquid crystal module according to claim 1, wherein a covered area of the first clip piece is larger than a covered area of the second clip piece.

3. The liquid crystal module according to claim 1, wherein the second frame is made of plastic and is formed by integral injection molding.

4. The liquid crystal module according to claim 1, further comprising a grounding conductive sheet configured to protect the control printed circuit board from electro-magnetic interference.

5. The liquid crystal module according to claim 4, wherein the grounding conductive sheet is made of copper and is formed by integral injection molding.

6. The liquid crystal module according to claim 4, wherein the grounding conductive sheet comprises:
   a first end electrically connected to the control printed circuit board; and
   a second end comprising a first engaging member configured to engage with the first frame.

7. The liquid crystal module according to claim 6, wherein the first end of the grounding conductive sheet is electrically connected to the control printed circuit board by welding.

8. The liquid crystal module according to claim 6, wherein the first engaging member is a resilient piece, and the first frame comprises a hook configured to engage with the resilient piece.

9. The liquid crystal module according to claim 6, wherein the first engaging member is a hook, and the first frame comprises a slot configured to engage with the hook.

10. The liquid crystal module according to claim 6, wherein the first end and second end of the grounding conductive sheet are substantially orthogonal with each other.

11. A liquid crystal module, comprising:
a first frame;
a second frame configured to support a back light module and configured to fixedly secure a liquid crystal display panel and the back light module together with the first frame;
wherein the second frame comprises:
a plurality of fasteners, each fastener including a first clip piece and a second clip piece opposite to the first clip piece, wherein a gap is disposed between the first clip piece and the second clip piece configured to fixedly secure a flexible printed circuit board therebetween;
a recess configured to receive a control printed circuit board;
a slot disposed at a periphery of the recess and configured to engage against one end of the control printed circuit board;
a plurality of protrusions disposed at the periphery of the recess configured to position the control printed circuit board; and
a plurality of resilient engaging pieces configured to fix the control printed circuit board.

12. The liquid crystal module according to claim 11, further comprising a grounding conductive sheet configured to protect the control printed circuit board from electromagnetic interference.

13. The liquid crystal module according to claim 12, wherein the grounding conductive sheet comprises:
a first end electrically connected to the control printed circuit board; and
a second end comprising an engaging member configured to engage with the first frame.

14. The liquid crystal module according to claim 13, wherein the engaging member is a resilient piece, and the first frame comprises a hook configured to engage with the resilient piece.

15. The liquid crystal module according to claim 13, wherein the first engaging member is a hook, and the first frame comprises a slot configured to engage with the hook.

16. The liquid crystal module according to claim 13, wherein the first end and second end of the grounding conductive sheet are substantially orthogonal with each other.

* * * * *